(12) United States Patent
Miyashita

(10) Patent No.: US 8,824,592 B2
(45) Date of Patent: Sep. 2, 2014

(54) MODULATED IMPULSE GENERATING APPARATUS AND TRANSMISSION APPARATUS

(71) Applicant: Fujitsu Limited, Kawasaki (JP)

(72) Inventor: Takumi Miyashita, Inagi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/849,687

(22) Filed: Mar. 25, 2013

(65) Prior Publication Data

US 2013/0301752 A1 Nov. 14, 2013

(30) Foreign Application Priority Data

May 14, 2012 (JP) ................................. 2012-110950

(51) Int. Cl.
*H04L 27/00* (2006.01)
*H04B 1/04* (2006.01)
*H03K 7/00* (2006.01)

(52) U.S. Cl.
CPC ... *H04B 1/04* (2013.01); *H03K 7/00* (2013.01)
USPC ........................................................ 375/295

(58) Field of Classification Search
CPC ..................................... H04B 1/04; H03K 7/00
USPC ........................................................ 375/295
See application file for complete search history.

(56) References Cited

U.S. PATENT DOCUMENTS

| | | | |
|---|---|---|---|
| 6,690,741 B1 * | 2/2004 | Larrick et al. | 375/295 |
| 8,437,423 B2 * | 5/2013 | Nakasha | 375/295 |
| 2008/0198939 A1 * | 8/2008 | Nakasha et al. | 375/256 |

FOREIGN PATENT DOCUMENTS

| | | |
|---|---|---|
| JP | 2008-205733 | 9/2008 |
| JP | 2008-288888 | 11/2008 |

* cited by examiner

*Primary Examiner* — Juan A Torres
(74) *Attorney, Agent, or Firm* — Staas & Halsey LLP

(57) ABSTRACT

A modulated impulse generating apparatus includes a source signal generator that generates a source signal, a first oscillation unit that, when activated, a signal having extracts a desired frequency component from the source signal generated by the source signal generator and causes amplitude of the extracted signal to increase, a second oscillation unit that, receives input of a signal caused to increase by the first oscillation unit, and that, when activated, causes amplitude of the input signal to increase together with the first oscillation unit and outputs a modulated impulse modulated wave, and an activation unit that activates the first oscillation unit after the source signal generated by the source signal generator has been input to the first oscillation unit and activates the second oscillation unit after a certain time period has elapsed and oscillation amplitude of the input signal has increased.

9 Claims, 8 Drawing Sheets

MODULATED IMPULSE GENERATING APPARATUS AND TRANSMISSION APPARATUS

CROSS-REFERENCE TO RELATED APPLICATION

This application is based upon and claims the benefit of priority of the prior Japanese Patent Application No. 2012-110950, filed on May 14, 2012, the entire contents of which are incorporated herein by reference.

FIELD

The embodiments discussed herein are related to a modulated impulse generating apparatus and a transmission apparatus.

BACKGROUND

With the increasing number of users of communication networks, such as the Internet, and with increases in capacity and variety of content, such as high-definition images, an increase in transmission capacity is desired in radio communication as well. As for a large-capacity radio transmission technique, the use of a millimeter-wave band has been considered which is not used by many commercial radio stations and in which a wide frequency band is readily ensured. Accordingly, attention has been paid to modulated impulse radio communication using a modulated impulse that is a signal whose pulse width is very small (a signal exhibiting an instantaneous increase and decrease in voltage).

A radio communication apparatus used for the modulated impulse radio communication does not necessarily have to include a high-precision local oscillation unit and a mixer in comparison to a narrow-band communication apparatus using a continuous carrier scheme. It is expected that such a radio communication apparatus will be an apparatus which allows a radio unit thereof to have a simple configuration and be provided at low cost and which allows large-capacity radio transmission of over 10 gigabits per second (10 Gbps) using a wide bandwidth.

A radio signal used in modulated impulse communication is a bandpass signal having a wide band with respect to a center frequency and two basic principles of generating a modulated impulse modulated wave will be exemplified below.

1. A modulated impulse modulated signal is obtained by modulating a local signal with a return to zero (RZ) data signal having a short pulse width as in the case of typical continuous wave communication.

2. A local oscillation unit is operated only during a time period over which an RZ data signal is at a high level.

In an existing radio communication apparatus, it takes time before an oscillation output level rises. Hence, power has to be supplied for a long time even when a single modulated impulse is generated, and it is difficult to effectively reduce power consumption.

When the first principle is used, a high-precision modulated impulse modulated wave may be generated; however, even when all circuits do not transmit modulated impulses, the circuits' still have to operate. When the second principle is used, the oscillation unit is stopped when a modulated impulse is not transmitted; however, it takes a long time for oscillation to start before a modulated impulse is then transmitted, thereby making it difficult to provide high-speed communication.

More realistic modulated impulse radio communication techniques, such as the following techniques, have been suggested. For example, there is a technique of the related art in which a modulated impulse is generated on the basis of a data signal of 10 Gbps input from a baseband unit and a frequency component used for communication is extracted from among wide band frequency components contained in the generated modulated impulse by using a band-limited filter.

There is another technique of the related art in which a bias of a delay-locked loop (DLL) is adjusted so as to be locked to a reference signal and sampling clocks having twice the desired carrier frequency are thereby generated, and transmission signals sequentially inverted using the sampling clocks are sampled to thereby generate a modulated impulse modulated wave.

However, in the technique of the related art using a band-limited filter, passage through the band-limited filter increases a time width of a modulated impulse and limits a modulation rate for communicating large volumes of high-speed data.

Furthermore, in the technique of the related art in which a carrier frequency is externally adjusted by using a reference signal and transmission data sequentially inverted by using generated sampling clocks is sampled to thereby generate a modulated impulse modulated wave, only a modulated impulse modulated wave having a frequency at which a sampling circuit operates, for example, about 2 GHz as an upper limit, is generated, and a modulation rate is less than or equal to a fraction of this frequency.

Examples of the related art include Japanese Laid-open Patent Publication No. 2008-205733 and Japanese Laid-open Patent Publication No. 2008-288888.

SUMMARY

According to an aspect of the embodiments, a modulated impulse generating apparatus includes a source signal generator that generates a source signal, a first oscillation unit that is an oscillation circuit including one or more amplifiers, and that, when activated, a signal having extracts a desired frequency component from the source signal generated by the source signal generator and causes amplitude of the extracted signal to increase, a second oscillation unit that is arranged at a stage subsequent to the first oscillation unit, is an oscillation circuit including one or more amplifiers, receives input of a signal caused to increase by the first oscillation unit, and that, when activated, causes amplitude of the input signal to increase together with the first oscillation unit and outputs a modulated impulse modulated wave, and an activation unit that activates the first oscillation unit after the source signal generated by the source signal generator has been input to the first oscillation unit and activates the second oscillation unit after a certain time period has elapsed and oscillation amplitude of the input signal has increased.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments of a modulated impulse generating apparatus and a transmission apparatus which are discussed herein will be described below in detail with reference to the drawings. The modulated impulse generating apparatus and the transmission apparatus which are discussed herein are not limited to the following embodiments. In the embodiments, as an example, a circuit that generates a modulated impulse modulated wave whose center frequency is 24 GHz will be described. Note that the center frequency of a modulated impulse is not limited to this and a frequency, such as 2-10 GHz, 60 GHz, 77 GHz, or 80 GHz, different from the example presented herein may also be used.

First Embodiment

Figure 1:
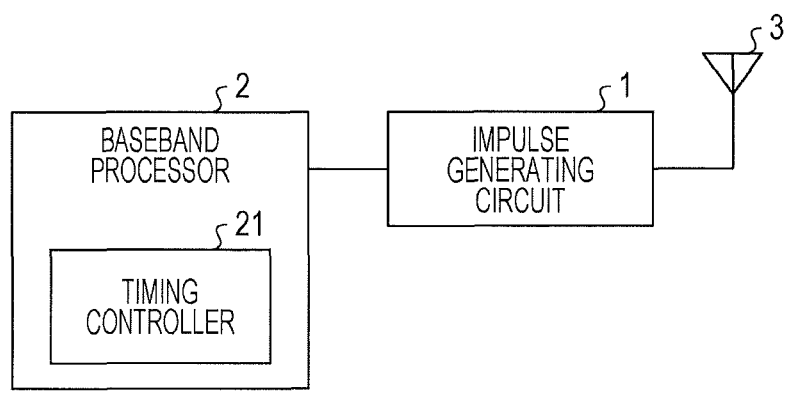
FIG. 1 is a block diagram of a transmission apparatus according to a first embodiment.

FIG. 1 is a block diagram of a transmission apparatus according to the first embodiment. As illustrated in FIG. 1, the transmission apparatus according to this embodiment includes a modulated impulse generating circuit 1, a baseband processor 2, and an antenna 3.

The baseband processor 2 performs an encoding process on a transmission signal. The baseband processor 2 further performs analog-to-digital (A/D) conversion of the transmission signal. Subsequently, the baseband processor 2 transmits the digitized transmission signal to the modulated impulse generating circuit 1. The baseband processor 2 includes a timing controller 21. As described below, the timing controller 21 inputs a precharge signal to the modulated impulse generating circuit 1 and controls the operation performed by the modulated impulse generating circuit 1 and the timing thereof by, for example, inputting a signal to activate an oscillation unit included in the modulated impulse generating circuit 1.

The modulated impulse generating circuit 1 receives input of the digitized transmission signal from the baseband processor 2. The modulated impulse generating circuit 1 then generates a modulated impulse representing the received digital signal. The process of generating a modulated impulse will be described below in detail. Subsequently, the modulated impulse generating circuit 1 transmits the generated modulated impulse to an apparatus that is a destination via the antenna 3.

Circuit Configuration of Modulated Impulse Generating Circuit

Figure 2:
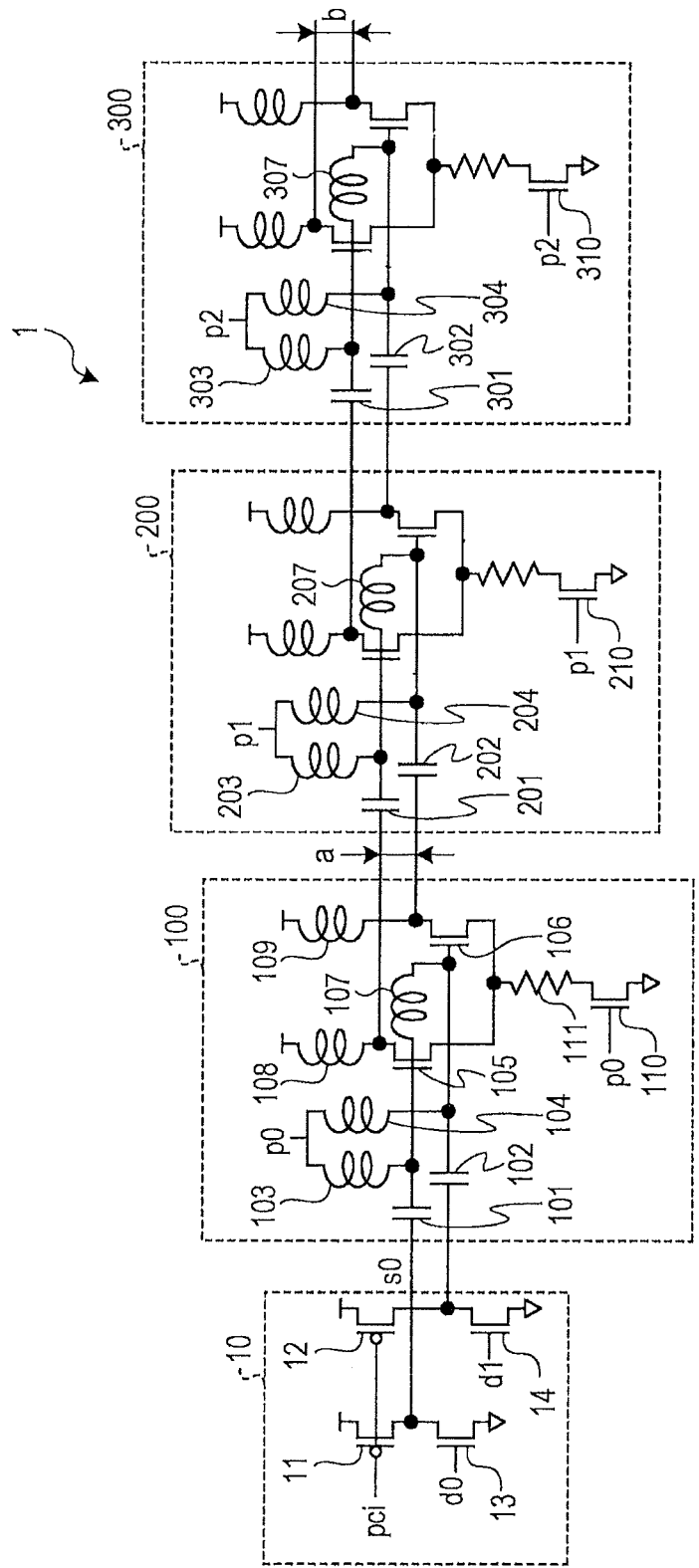
FIG. 2 is a circuit diagram of a modulated impulse generating circuit according to the first embodiment.

FIG. 2 is a circuit diagram of the modulated impulse generating circuit according to the first embodiment. As illustrated in FIG. 2, the modulated impulse generating circuit 1 according to this embodiment includes a source signal generator 10. The modulated impulse generating circuit 1 further includes an oscillation unit 100 at a stage subsequent to the source signal generator 10. The modulated impulse generating circuit 1 further includes an oscillation unit 200 at a stage subsequent to the oscillation unit 100. The oscillation unit 200 is connected in series with the oscillation unit 100. The modulated impulse generating circuit 1 further includes an oscillation unit 300 at a stage subsequent to the oscillation unit 200. The oscillation unit 300 is connected in series with the oscillation unit 200.

The source signal generator 10 includes metal-oxide-semiconductor field-effect transistors (MOSFETs) 11, 12, 13, and 14.

The MOSFETs 11 and 12 are P-channel MOSFETs. A precharge signal is input to the MOSFETs 11 and 12. When the precharge signal is Low, the precharge signal is input to the MOSFETs 11 and 12, and a negative voltage is applied to gates of the MOSFETs 11 and 12 so as to put the P-channel MOSFETs 11 and 12 into an ON state.

The MOSFETs 13 and 14 are N-channel MOSFETs. Data is input to the MOSFETs 13 and 14. Specifically, when the data is 1, the data is input to the MOSFET 13, and when the data is 0, the data is input to the MOSFET 14. When the data is High, the data is input to the MOSFET 13, and a positive voltage is applied to a gate of the MOSFET 13 so as to put the N-channel MOSFET 13 into an ON state. The operation performed by the MOSFET 14 on the basis of input of data is similar to that of the MOSFET 13.

The oscillation unit 100 includes capacitors 101 and 102, inductors 103 and 104, MOSFETs 105 and 106, an inductor 107, inductors 108 and 109, a MOSFET 110, and a resistor 111.

The capacitor 101 is connected to the MOSFETs 11 and 13. The inductor 107 is connected in series with the capacitor 101 on the opposite side to the MOSFETs 11 and 13. The inductor 103 is provided between a connection point on a path between the capacitor 101 and the inductor 107 and an external input terminal. The MOSFET 105 is connected in series with the capacitor 101 at a point, as a connection point, between a connection point of the inductor 103 and the inductor 107. That is, the MOSFET 105 is connected in parallel with the inductor 107. A first activation signal is input to the inductor 103 from the baseband processor 2. The inductor 108 is connected in series with the supply-voltage side of the MOSFET 105. The resistor 111 is connected in series with the ground side of the MOSFET 105. A path extends from a point, as a connection point, between the MOSFET 105 and the inductor 108 to the oscillation unit 200.

The capacitor 102 is connected to the MOSFETs 12 and 14. The inductor 107 is connected in series with the capacitor 102 on the opposite side to the MOSFETs 12 and 14. That is, the inductor 107 is connected in series between the capacitors 101 and 102. The inductor 104 is provided between a connection point on a path between the capacitor 102 and the inductor 107 and an external input terminal. The MOSFET 106 is connected in series with the capacitor 102 at a point, as a connection point, between a connection point of the inductor 104 and the inductor 107. That is, the MOSFET 106 is connected in parallel with the inductor 107. The first activation signal is input to the inductor 104 from the baseband processor 2. The inductor 109 is connected in series with the supply-voltage side of the MOSFET 106. The resistor 111 is connected in series with the ground side of the MOSFET 106. The ground side of the MOSFET 106 and the ground side of the MOSFET 105 are connected to each other. The side of the resistor 111 opposite to the MOSFETs 105 and 106 is connected to the supply-voltage side of the MOSFET 110. The first activation signal is input to the MOSFET 110. A path extends from a point, as a connection point, between the MOSFET 106 and the inductor 109 to the oscillation unit 200.

The oscillation units 200 and 300 have a similar configuration to that of the oscillation unit 100. Note that second activation signals are input to inductors 203 and 204 of the oscillation unit 200 and inductors 303 and 304 of the oscillation unit 300 from the baseband processor 2. The second activation signals are also input to a MOSFET 210 of the oscillation unit 200 and a MOSFET 310 of the oscillation unit 300 from the baseband processor 2. A connection terminal of the oscillation unit 300 on the opposite side to the oscillation unit 200 is connected to the antenna 3.

As described in detail below, in the modulated impulse generating circuit 1 according to this embodiment, the oscillation unit 100 amplifies the power of a signal having a frequency of 24 GHz by using a source signal generated by the source signal generator 10 and causes the amplitude thereof to increase. Subsequently, the signal whose amplitude has been caused to increase by the oscillation unit 100 is input to the oscillation units 200 and 300, and the oscillation units 200 and 300 cause the amplitude of the signal having a frequency of 24 GHz to increase to thereby output a short modulated impulse, so that more satisfactory isolation is obtained. In this embodiment, a group of one or more oscillation units that cause the amplitude of a source signal to increase is referred to as "a first-stage oscillation unit". A group of one or more oscillation units that cause the amplitude of the signal input from the first-stage oscillation unit to increase and output and modulated impulse is referred to as "a second-stage oscillation unit". In this embodiment, the first-stage oscillation unit includes the oscillation unit 100 and the second-stage oscillation unit includes the oscillation units 200 and 300.

The source signal generator 10 and the oscillation unit 100 are configured so that impedance matching therebetween is attained when the oscillation unit 100 is in an inactive state without the first activation signal being input to the oscillation unit 100. In other words, when the oscillation unit 100 is in an active state, impedance matching between the source signal generator 10 and the oscillation unit 100 is not attained.

The oscillation unit 100 and the oscillation units 200 and 300 are configured so that impedance matching therebetween is attained when the oscillation units 100 to 300 are in an active state after the first activation signal is input to the oscillation unit 100 and the second activation signals are input to the oscillation units 200 and 300. In other words, when the oscillation unit 100 is activated and the oscillation units 200 and 300 are in an inactive state, impedance matching between the oscillation unit 100 and the oscillation units 200 and 300 is not attained.

When the oscillation unit 100 causes the amplitude of a signal to increase, a reflected wave from between the oscillation unit 100 and the oscillation unit 200 may contribute to the increase of the amplitude. The number of oscillation units included in the first-stage oscillation unit is determined so that the signal having a frequency of 24 GHz output by the oscillation unit 100 is reflected as much as possible by the oscillation unit 200 in a state in which impedance matching between the oscillation unit 100 and the oscillation unit 200 is not attained. Also, the number of oscillation units included in the first-stage oscillation unit is determined so that a demanded gain may be obtained within a certain period of time.

Isolation improves as the number of oscillation units included in the second-stage oscillation unit increases. However, the increase in the number of oscillation units increases power consumption of circuitry. When the oscillation units 200 and 300 cause the amplitude of a signal to increase, a reflected wave from between the oscillation unit 300 and the antenna 3 may contribute to the increase of the amplitude. The number of oscillation units included in the second-stage oscillation unit is preferably determined in view of conditions that isolation is improved, power consumption be suppressed as much as possible, and the reflected wave from the antenna 3 increase a frequency component of 24 GHz.

For example, a configuration in which the first-stage oscillation unit includes one oscillation unit and the second-stage oscillation unit includes two oscillation units as in this embodiment is an example in which, in the case where a signal having a frequency of 24 GHz is amplified, a satisfactory reflected wave may be obtained and the signal may be generated within a certain period of time so that a predetermined gain is obtained. In addition, the configuration of this embodiment is an example in which satisfactory isolation may be obtained and power consumption may be suppressed as much as possible.

Operation Performed by Modulated Impulse Generating Circuit

Next, the operation performed by the modulated impulse generating circuit 1 according to this embodiment will be described. The operation in the case where data of 1 is input, that is, in the case where a voltage is applied to the MOSFET 13, will be described below. The operation in the case where data of 0 is input, that is, in the case where a signal is input to the MOSFET 14, is similar to that in the following description, and description thereof is omitted.

The baseband processor 2 inputs a precharge signal, when not inputting a data signal, so as to apply a Low gate voltage to the MOSFETs 11 and 12. Application of the Low gate voltage puts the MOSFETs 11 and 12, which are P-channel MOSFETs, into an ON state. When the MOSFETs 11 and 12 are put into an ON state, power is supplied from a supply voltage and electric charges accumulate in the capacitors 101 and 102.

Figure 3:
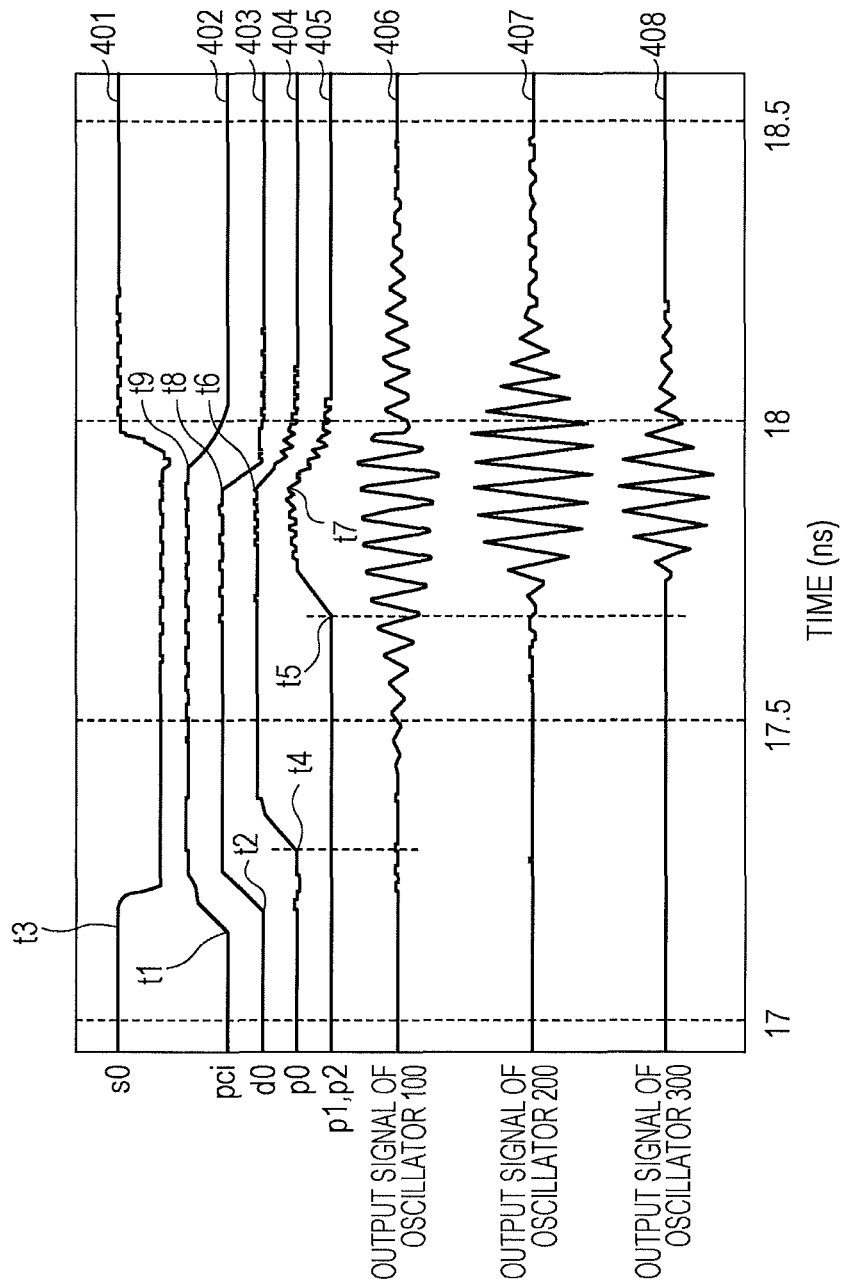
FIG. 3 is a timing chart illustrating control signals and output signals.

FIG. 3 is a timing chart illustrating control signals and output signals. A source signal s0 indicated by a graph 401 in FIG. 3 represents a voltage applied to the oscillation unit 100. A signal pci indicated by a graph 402 represents a precharge signal input to the MOSFETs 11 and 12. A signal d0 indicated by a graph 403 represents a signal input to the MOSFET 13. A signal p0 indicated by a graph 404 represents the first activation signal input to the oscillation unit 100. Signals p1 and p2 indicated by a graph 405 represent the second activation signals input to the oscillation unit 200 and the oscillation unit 300, respectively. A graph 406 represents an output signal of the oscillation unit 100. A graph 407 represents an output signal of the oscillation unit 200. A graph 408 represents an output signal of the oscillation unit 300. Here, the graphs 406 to 408 each represent a simulation result, that is, an output in the case where the output of each oscillation unit has been measured at each time. The vertical axis in FIG. 3 represents, for the signals s0, d0, pci, p0, p1, and p2, whether each signal is at a High level or Low level, and represents, for the output signals of the oscillation units 100 to 300, the amplitude thereof. The horizontal axis represents elapsed time. In the following description, for ease of understanding, the reference numerals of the signals used in FIG. 3, i.e., s0, d0, pci, p0, p1, and p2, are attached to the signals so as to represent the respective signals.

The precharge signal pci changes to High at a time t1 in FIG. 3 and charging is stopped.

When the precharge signal pci changes to High, the baseband processor 2 inputs the signal d0 to the MOSFET 13 at a time t2. When the signal d0 is input to the MOSFET 13, the MOSFET 13 is put into an ON state. Because the MOSFET 13 is connected to a ground when the MOSFET 13 is put into an ON state, electric charges are drawn from the capacitor 101 and voltage changes from High to Low.

The electric charges are drawn from the capacitor 101 and the voltage changes from High to Low, and the source signal s0, which is a source of oscillation, is thereby injected into the oscillation unit 100 at a time t3. The source signal s0 has a stepped transition waveform (hereinafter referred to as "staircase waveform"). Here, because the capacitor 101 has been charged with the precharge signal pci, when the MOSFET 13 is put into an ON state, the source signal s0 has a steep staircase waveform. This allows the source signal s0 having a desired frequency to be injected into the oscillation unit 100 in a short time period. At this time, the oscillation unit 100 is not active because the first activation signal p0 has not been input. Hence, impedance matching between the source signal generator 10 and the oscillation unit 100 is attained. Thus, the source signal s0 is injected into the oscillation unit 100 practically without any loss.

The source signal s0 is input to the oscillation unit 100 and the oscillation unit 100 thereby receives input of a signal component having a frequency of 24 GHz contained at a falling edge of the source signal s0. Subsequently, the baseband processor 2 inputs the first activation signal p0 to the inductors 103 and 104 and the MOSFET 110 that are included in the oscillation unit 100 at a time t4. The baseband processor 2 stores a time period between the time t1 and the time t4 in advance and inputs the first activation signal p0 to the oscillation unit 100 after the stored time period has elapsed since the baseband processor 2 input the signal d0. Hence, a gate voltage is applied to the MOSFETs 105, 106 and 110 so as to put each one into an ON state. The MOSFETs 105, 106 and 110 are put into an ON state and the amplitude of the signal component having a frequency of 24 GHz is thereby amplified by the resonance of the capacitor 101, the inductor 107, and the capacitor 102. At this time, because the oscillation unit 100 is active, impedance matching between the source signal generator 10 and the oscillation unit 100 is not attained. Hence, the source signal generator 10 functions as a reflector for output from the oscillation unit 100 to the source signal generator 10 and partially reflects the output signal. The oscillation units 200 and 300 are in an inactive state and impedance matching between the oscillation unit 100 and the oscillation units 200 and 300 is not attained. Hence, the oscillation unit 200 functions as a reflector for output from the oscillation unit 100 to the oscillation unit 200 and partially reflects the output signal. These reflected signals are added to the signal amplified by the capacitor 101, the inductor 107, and the capacitor 102, thereby contributing to the amplification of the signal.

Subsequently, the baseband processor 2 inputs the second activation signal p1 to the inductors 203 and 204 and the MOSFET 210 that are included in the oscillation unit 200 at a time t5. The baseband processor 2 also inputs the second activation signal p2 to the inductors 303 and 304 and the MOSFET 310 that are included in the oscillation unit 300. The baseband processor 2 stores a time period between the time t4 and the time t5 in advance and inputs the second activation signals p1 and p2 to the oscillation units 200 and 300, respectively, after the stored time period has elapsed since the baseband processor 2 input the first activation signal p0. Here, the time period between the time t4 and the time t5 is preferably set to a time period taken for amplitude to fully increase inside the oscillation unit 100 as indicated by the graph 406 in FIG. 3. When the second activation signals p1 and p2 are input to the oscillation units 200 and 300, the oscillation units 200 and 300 are activated. At this time, because impedance matching between the oscillation unit 100 and the oscillation units 200 and 300 is attained, an output signal having a frequency of 24 GHz flows into the oscillation unit 200 from the oscillation unit 100.

As indicated by the graph 406 in FIG. 3, because the amplitude has already increased in the oscillation unit 100 at the time t5, the oscillation unit 200 receives input of the signal whose amplitude has increased. Hence, as indicated by the graph 407 in FIG. 3, the amplitude of the signal rapidly rises in the oscillation unit 200. A capacitor 201, an inductor 207, and a capacitor 202 that are included in the oscillation unit 200 cause the amplitude of the signal having a frequency of 24 GHz to increase. Furthermore, while the oscillation unit 300 is outputting signals from the antenna 3, the output signals are partially reflected back from the antenna 3 to the oscillation unit 300. These reflected signals are added to the signal whose amplitude is caused to increase by the capacitor 201, the inductor 207, and the capacitor 202, thereby contributing to the increase of the amplitude.

Figure 4:
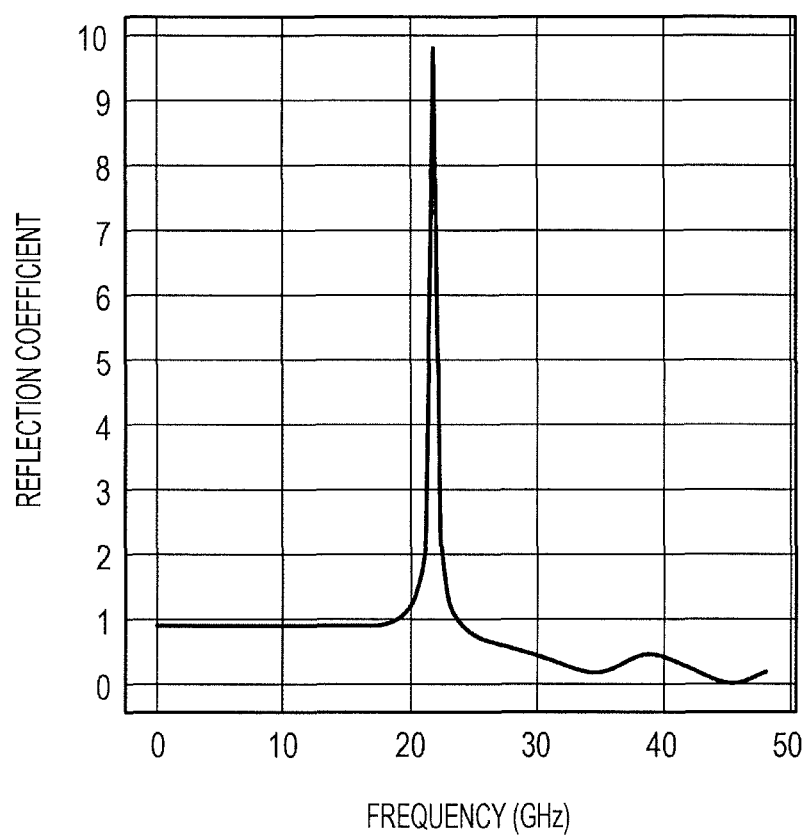
FIG. 4 illustrates a reflection coefficient in the case of externally viewing an intermediate setting between a first-stage oscillation unit and a second-stage oscillation unit in a period of increasing amplitude in the first embodiment.

FIG. 4 illustrates a reflection coefficient in the case of externally viewing an intermediate setting between the first-stage oscillation unit and the second-stage oscillation unit in a period of increasing amplitude in the first embodiment. Here, the term "period of increasing amplitude" refers to a period over which amplitude increases in the oscillation unit 100 without the oscillation units 200 and 300 being activated. FIG. 4 illustrates the reflection coefficient obtained by simulating a reflected wave at a point an in FIG. 2. In FIG. 4, the vertical axis represents the reflection coefficient and the horizontal axis represents frequency. As illustrated in FIG. 4, the reflection coefficient is a maximum in the vicinity of 24 GHz. That is, in the period of increasing amplitude, many reflected waves having a frequency of 24 GHz are present between the oscillation unit 100 and the oscillation unit 200, and it is found that the reflected waves significantly contribute to the increase of the amplitude of the signal having a frequency of 24 GHz.

Furthermore, the oscillation unit 300 receives input of the output signal having a frequency of 24 GHz from the oscillation unit 200. Here, the oscillation unit 300 receives input of the signal whose amplitude has been caused to further increase in the oscillation unit 200. This allows the oscillation unit 300 to increase the amplitude of the signal more steeply than the oscillation unit 200 does. A capacitor 301, an inductor 307, and a capacitor 302 that are included in the oscillation unit 300 cause the amplitude of the signal having a frequency of 24 GHz to increase by the resonance thereof. The oscillation unit 300 outputs the signal from the antenna 3 while causing the amplitude to increase. That is, the oscillation unit 300 outputs a modulated impulse indicated by the graph 408 in FIG. 3 from the antenna 3. As described above, while the oscillation unit 300 is outputting signals from the antenna 3, the output signals are partially reflected back from the antenna 3 to the oscillation unit 300. These reflected signals are added to the signal whose amplitude is caused to increase by the capacitor 301, the inductor 307, and the capacitor 302, thereby contributing to the increase of the amplitude.

Figure 5:
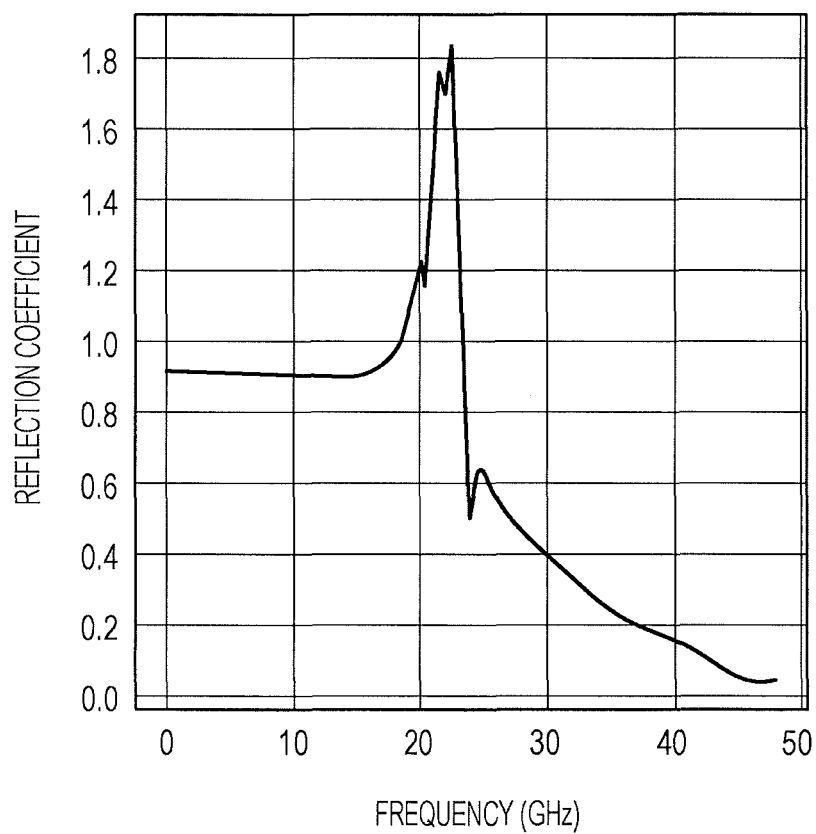
FIG. 5 illustrates a reflection coefficient of a reflected signal in an output terminal of an oscillation unit in an output period.

FIG. 5 illustrates a reflection coefficient of a reflected signal in an output terminal of the oscillation unit 300 in an output period. Here, the term "output period" refers to a period over which a modulated impulse is output from the oscillation unit 300 via the antenna 3. FIG. 5 illustrates the reflection coefficient obtained by simulating a reflected wave at a point b in FIG. 2. In FIG. 5, the vertical axis represents the reflection coefficient and the horizontal axis represents frequency. As illustrated in FIG. 5, the reflection coefficient is a maximum in the vicinity of 24 GHz. That is, in the output period, many reflected waves having a frequency of 24 GHz are present between the oscillation unit 300 and the antenna 3, and it is found that the reflected waves significantly contribute to the increase of the amplitude of the signal having a frequency of 24 GHz.

Subsequently, the baseband processor 2 stops inputting the first activation signal p0 to the oscillation unit 100 at a time t6. For example, the baseband processor 2 stores a time period between the time t4 and the time t6 in advance and stops inputting the first activation signal p0 after the stored time period has elapsed since the baseband processor 2 input the first activation signal p0. Accordingly, as indicated by the graph 406, the signal output from the oscillation unit 100 settles.

The baseband processor 2 stops inputting the second activation signals p1 and p2 to the oscillation units 200 and 300 at a time t7 that is substantially the same as the time t6. For example, the baseband processor 2 stores a time period between the time t5 and the time t7 in advance and stops inputting the second activation signals p1 and p2 after the stored time period has elapsed since the baseband processor 2 input the second activation signals p1 and p2 to the oscillation units 200 and 300, respectively. Accordingly, as indicated by the graphs 407 and 408, the signals output from the oscillation units 200 and 300 settle.

As indicated by the graph 408 in FIG. 3, the signal having a frequency of 24 GHz output from the oscillation unit 300 exhibits better isolation. A time period taken for the signal having a frequency of 24 GHz output from the oscillation unit 300 to rise is shorter than those for, for example, the signals output from the oscillation unit 100 and the oscillation unit 200. Furthermore, a time period taken for the signal having a frequency of 24 GHz output from the oscillation unit 300 to settle from the rise is shorter than those for, for example, the signals output from the oscillation unit 100 and the oscillation unit 200.

Figure 6:
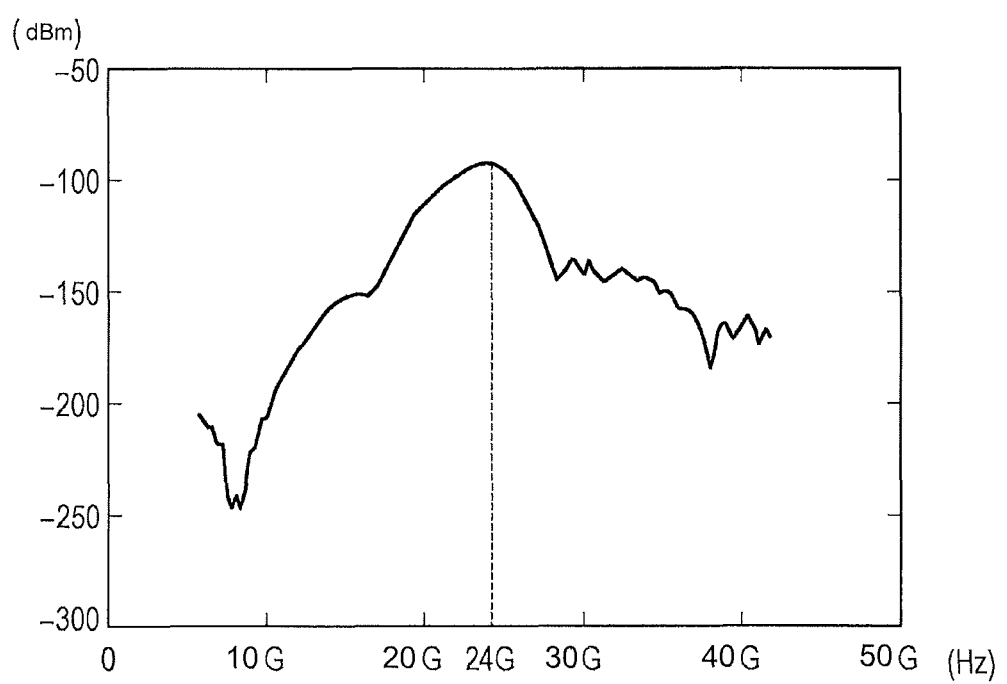
FIG. 6 illustrates a spectrum of a single modulated impulse output from the modulated impulse generating circuit according to the first embodiment.

FIG. 6 illustrates a spectrum of a single modulated impulse output from the modulated impulse generating circuit 1 according to the first embodiment. Specifically, FIG. 6 illustrates values obtained by performing a Fourier transform on the single modulated impulse output from the modulated impulse generating circuit 1 according to this embodiment. In FIG. 6, the vertical axis represents signal strength and the horizontal axis represents frequency.

As illustrated in FIG. 6, the modulated impulse output from the modulated impulse generating circuit 1 according to this embodiment contains a signal component of a frequency of 24 GHz as the strongest component. Thus, it is found that use of the modulated impulse generating circuit 1 according to this embodiment allows a modulated impulse having a frequency of 24 GHz to be transmitted to the apparatus that is a destination.

Referring back to FIG. 3, as indicated by the graph 403, the baseband processor 2 stops inputting the signal d0, which is data, at a time t8 after input of the first activation signal p0 and the second activation signals p1 and p2 is stopped. Accordingly, input of the source signal s0 to the oscillation unit 100 is stopped. Furthermore, the baseband processor 2 reduces, in response to the stopping of input of the signal d0, the voltage of the precharge signal pci to be input to the MOSFETs 11 and 12 to a Low level at a time t9. This puts the MOSFETs 11 and 12 into an ON state. Subsequently, the baseband processor 2 maintains the voltage of the precharge signal pci at the Low level until the baseband processor 2 inputs a subsequent signal, and electric charges accumulate in the capacitors 101 and 102.

Here, the signal input to the MOSFET 13 by the baseband processor 2 is referred to as the signal d0, whereas a signal input to the MOSFET 14 by the baseband processor 2 is hereinafter referred to as a signal d1. After a single input of data is completed, the baseband processor 2 inputs the signal d0 to the MOSFET 13 when subsequent data to be input is data of 1, and inputs the signal d1 to the MOSFET 14 when the subsequent data to be input is data of 0. Thus, the modulated impulse generating circuit 1 according to this embodiment generates and transmits a modulated impulse representing the input data in accordance with the signal d0 or d1 representing the data input by the baseband processor 2.

Figure 7:
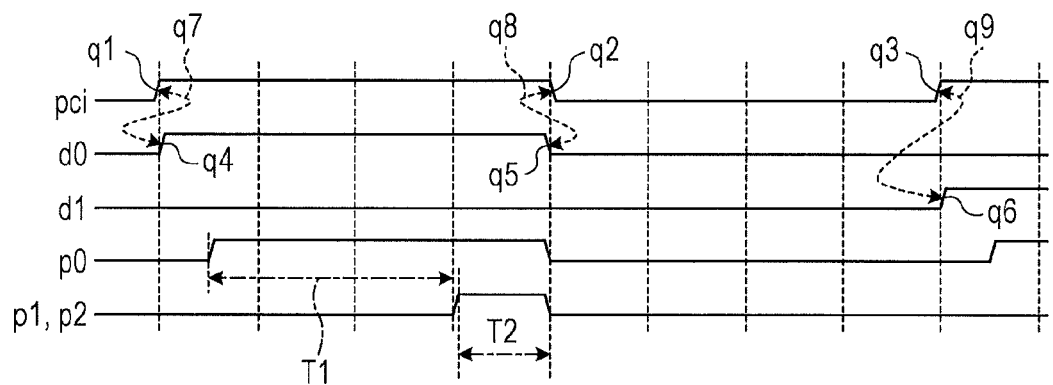
FIG. 7 illustrates the transition of control signals in the case where a subsequent signal d1 is input after a signal d0 is input.

The overall flow of input of data and input of control signals will be described with reference to FIG. 7. FIG. 7 illustrates the transition of the control signals in the case where the subsequent signal d1 is input after the signal d0 is input.

The capacitors 101 and 102 are precharged with the precharge signal pci which is in a Low state. Then, the precharge signal pci changes to High at a timing q1 and the signal d0 are input at a timing q4. Electric charges which were precharged are thereby drawn out and the source signal s0 is input to the oscillation unit 100. Subsequently, as indicated by an arrow q7, the change in the state of the precharge signal pci to High triggers input of the first activation signal p0 to the oscillation unit 100. After a time period T1 has elapsed, the second activation signals p1 and p2 are input to the oscillation units 200 and 300. During the time period T1, reflected waves from the source signal generator 10 and the oscillation unit 200 and an increase in amplitude caused by the oscillation unit 100 itself cause the amplitude of the source signal s0 to increase.

Furthermore, after the second activation signals p1 and p2 are input to the oscillation units 200 and 300, the amplitude of the signal is caused to increase in the oscillation units 200 and 300 so that a desired gain is obtained during a time period T2 that is shorter than the time period T1. Then, a modulated impulse having a short width generated by the oscillation units 200 and 300 is output from the oscillation unit 300. At this time, the modulated impulse output from the oscillation unit 300 represents the content represented by the signal d0, for example, data "0".

Subsequently input of the signal d0 is stopped at a timing q5. Then, as indicated by an arrow q8, the stopping of input of the signal d0 triggers a change in the state of the precharge signal pci to Low at a timing q2. Precharging of the capacitors 101 and 102 is thereby restarted with the precharge signal pci. While the signal d0 is being input, the signal d1 is not input.

Next, the capacitors 101 and 102 continue to be precharged with the precharge signal pci which is in a Low state. Subsequently, the precharge signal pci changes to High at a timing q3. Then, as indicated by an arrow q9, the change in the state of the precharge signal pci to High triggers input of the signal d1 at a timing q6.

Subsequently, as in the case of the signal d0, the first activation signal p0 is input, and the modulated impulse generating circuit 1 inputs the second activation signals p1 and p2 after having caused the amplitude of the source signal s0 to increase. Then, a modulated impulse having a short width generated by the oscillation units 200 and 300 is output from the oscillation unit 300. At this time, the modulated impulse output from the oscillation unit 300 represents the content represented by the signal d1, for example, data "1".

Figure 8:
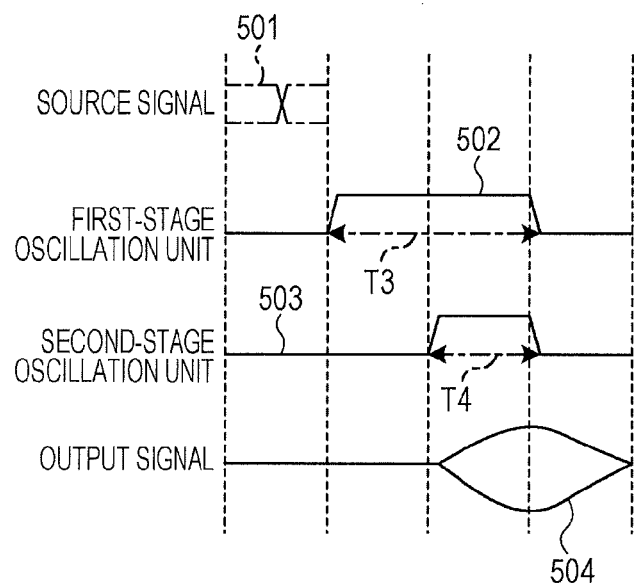
FIG. 8 is a timing diagram before a modulated impulse is generated.

Furthermore, an outline of timings at which the source signal generator 10 and the oscillation units 100 to 300 operate will be described with reference to FIG. 8. FIG. 8 is a timing diagram before a modulated impulse is generated. In FIG. 8, the vertical axis represents objects which operate and types of signals, and the horizontal axis represents time.

First, the source signal s0 having a staircase waveform indicated by a waveform 501 is input to the first-stage oscillation unit. In this embodiment, the source signal s0 is input to the oscillation unit 100.

After the source signal s0 has been input, the first activation signal is input to the first-stage oscillation unit so as to activate the first-stage oscillation unit. Then, the first-stage oscillation unit remains activated during a time that elapses before input of the first activation signal is stopped, that is, a period T3 in a graph 502. In this embodiment, the first activation signal p0 is input to the oscillation unit 100 and the oscillation unit 100 remains activated during the period T3.

Subsequently, the second activation signals are input to the second-stage oscillation unit so as to activate the second-stage oscillation unit. Then, the second-stage oscillation unit remains activated during a time that elapses before input of the second activation signals is stopped, that is, a period T4 in a graph 503. In this embodiment, the second activation signals p1 and p2 are input to the oscillation units 200 and 300, and the oscillation units 200 and 300 remain activated during the period T4.

The amplitude of an output signal increases while the second-stage oscillation unit remains activated, and the amplitude decreases when the second-stage oscillation unit is deactivated. Accordingly, an envelope of the output signal becomes similar to a signal 504. This signal 504 is one modulated impulse.

Figure 9:
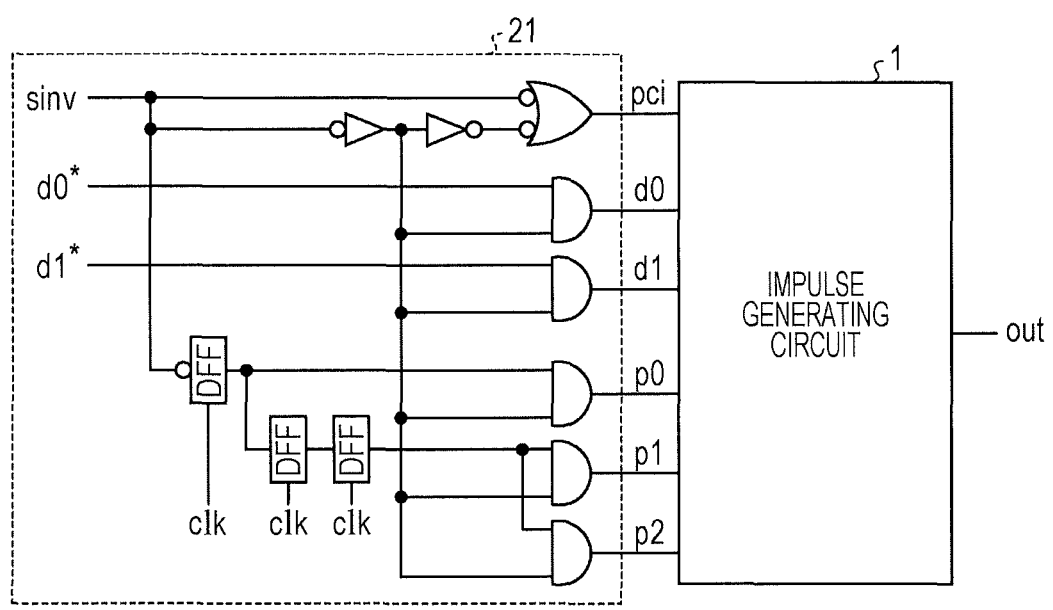
FIG. 9 is a circuit diagram of a timing controller in a baseband processor.

FIG. 9 is a circuit diagram of the timing controller in the baseband processor. The timing controller 21 makes an inverted signal to be sent (sinv) Low, so that the precharge signal pci to be input to the modulated impulse generating circuit 1 becomes Low. The timing controller 21 makes the precharge signal pci Low and thereby starts a modulated impulse generating sequence in the modulated impulse generating circuit 1. Furthermore, a processor (not illustrated) included in the baseband processor 2 transmits data d0* and d1* simultaneously with the sending of the sinv. The timing controller 21 inputs the signal d0 or d1 to the modulated impulse generating circuit 1 by using the sinv, the data d0* and d1* which have been transmitted by the baseband processor. Then, the baseband processor 2 adjusts a delay time with gate delay based on a clock (clk) and a delay flip flop (DFF) and outputs the control signals to the modulated impulse generating circuit 1.

As described above, the modulated impulse generating circuit 1 according to this embodiment amplifies power of a source signal in the first-stage oscillation unit so as to cause the amplitude to increase. Subsequently, the modulated impulse generating circuit 1 activates the second-stage oscillation unit and causes the amplitude of a signal to increase in a short time period in the second-stage oscillation unit so as to generate a modulated impulse whose rise time is short, and satisfactory isolation is obtained. This allows modulated impulses that each exhibit a rapid rise and have a short time width to be generated. Each modulated impulse is short, thereby increasing the density of the modulated impulses and allowing transmission of large amounts of information in a short time period.

The modulated impulse generating circuit 1 according to this embodiment performs only precharging and does not operate the oscillation units during a period of not transmitting a signal, thereby allowing power consumption during an idle period to be suppressed and allowing power consumption per modulated impulse to be reduced.

Here, in this embodiment, data of 0 and data of 1 are generated by sending electricity to either of two systems in a differential circuit; however, the method of generating data is not limited to this. Only one of the two systems may be operated and, for example, data of 1 may be generated when a signal is transmitted and data of 0 may be generated when a signal is not transmitted.

In this embodiment, in order to generate a modulated impulse having a frequency of 24 GHz, one oscillation unit is arranged in the first-stage oscillation unit and two oscillation units are arranged in the second-stage oscillation unit. This is determined so that a demanded gain may be obtained within a certain period of time in accordance with increase of the amplitude of a signal having a frequency of 24 GHz, efficiency of a reflected wave in each oscillation unit is increased, isolation is improved, and power consumption is suppressed as much as possible. Accordingly, the number of oscillation units arranged in each stage oscillation unit is preferably changed in accordance with a frequency of a modulated impulse to be generated. For example, in the case where a modulated impulse having a frequency of 60 GHz is generated, an appropriate modulated impulse is generated when the first-stage oscillation unit has four oscillation units and the second-stage oscillation unit has four oscillation units.

Second Embodiment

A transmission apparatus according to this embodiment differs from that in the first embodiment in that a modulated impulse is modulated by adjusting a time period during which the second-stage oscillation unit in the modulated impulse generating circuit remains activated. The transmission apparatus according to this embodiment is also depicted by the block diagram illustrated in FIG. 1. The modulated impulse generating circuit 1 according to this embodiment also has the circuit configuration illustrated in FIG. 2. Description of parts having similar functions to those in the first embodiment is omitted below.

As in the first embodiment, the baseband processor 2 makes the precharge signal pci to be input to the modulated impulse generating circuit 1 Low and thereby precharges the modulated impulse generating circuit 1. After precharging has been completed, the baseband processor 2 makes the precharge signal pci Low. Then, the baseband processor 2 inputs the signal d0 to the modulated impulse generating circuit 1.

Subsequently, the baseband processor 2 inputs the first activation signal p0 to the oscillation unit 100 of the modulated impulse generating circuit 1. This activates the oscillation unit 100 and causes the amplitude of the source signal s0 to increase. The baseband processor 2 inputs the second activation signals p1 and p2 to the oscillation units 200 and 300 after a certain time period has elapsed since the first activation signal p0 was input. This causes the amplitude of a signal to increase in a short time period. The above operations are similar to those in the first embodiment.

Subsequently, the baseband processor 2 adjusts, in accordance with the content of data desired to be transmitted, times at which the activation of the oscillation units 100 to 300 is terminated and thereby modulates a signal. For example, the modulated impulse having a length generated in the first embodiment is a signal representing that data is "1". The baseband processor 2 adjusts the times at which the activation of the oscillation units 100 to 300 is terminated so that a modulated impulse having twice the length is generated. Then, the baseband processor 2 transmits the modulated impulse having twice the length of the modulated impulse generated in the first embodiment as a signal representing that data is "2".

Modulation in the case of generating the modulated impulse having twice the length is described here; however, the modulation is not limited to this. The baseband processor 2 adjusts times at which the activation of the oscillation units 100 to 300 is terminated and thereby may generate a modulated impulse having an appropriate length. Also, the baseband processor 2 does not activate the second-stage oscillation unit and terminates the activation of the first-stage oscillation unit, thereby allowing no transmission of a modulated impulse.

As described above, the transmission apparatus according to this embodiment adjusts a time period during which the second-stage oscillation unit remains activated and thereby may perform high-level modulation.

The modulated impulse generating circuit according to each embodiment may be used for, for example, ultra wide band (UWB) modulated impulse communication, modulated impulse radar, and UWB imaging.

In each embodiment, the MOSFETs are used as switches; however, as long as a switch is turned ON or OFF by using a voltage or a current, other switches may be used. For example, another transistor, such as a bipolar transistor, may be used as a switch. When a bipolar transistor or the like is used, the bipolar transistor is turned ON or OFF by controlling a base bias.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A modulated impulse generating apparatus comprising:
   a source signal generator that generates a source signal;
   a first oscillation unit that is an oscillation circuit including one or more amplifiers, and that, when activated, a signal having extracts a desired frequency component from the source signal generated by the source signal generator and causes amplitude of the extracted signal to increase;
   a second oscillation unit that is arranged at a stage subsequent to the first oscillation unit, is an oscillation circuit including one or more amplifiers, receives input of a signal caused to increase by the first oscillation unit, and that, when activated, causes amplitude of the input signal to increase together with the first oscillation unit and outputs a modulated impulse modulated wave; and
   an activation unit that activates the first oscillation unit after the source signal generated by the source signal generator has been input to the first oscillation unit and activates the second oscillation unit after a certain time period has elapsed and oscillation amplitude of the input signal has increased.

2. The modulated impulse generating apparatus according to claim 1, wherein the first oscillation unit and the second oscillation unit are each an oscillation circuit using an LC resonant circuit.

3. The modulated impulse generating apparatus according to claim 1, wherein the activation unit controls a gate or a base bias of a transistor connecting between a ground and the first oscillation unit or the second oscillation unit so as to bring the transistor into conduction and activates the first oscillation unit or the second oscillation unit.

4. The modulated impulse generating apparatus according to claim 1, wherein the source signal generator generates a source signal having a stepped waveform.

5. The modulated impulse generating apparatus according to claim 1, further comprising:
   a differential input switcher that repeatedly selects, in turn, one and the other of differential inputs of the source signal generator and switches between input of signals to the first oscillation unit,
   wherein the source signal generator, the first oscillation unit, and the second oscillation unit is each a differential circuit.

6. The modulated impulse generating apparatus according to claim 1, wherein the activation unit adjusts a modulated impulse width by modulating time periods during which the first oscillation unit and the second oscillation unit remain activated.

7. The modulated impulse generating apparatus according to claim 1, further comprising:
   a timing generating circuit,
   wherein the activation unit activates the first oscillation unit by using a first timing pulse generated by the timing generating circuit and activates the second oscillation unit by using a second timing pulse which exhibits a timing different from that of the first timing pulse generated by the timing generating circuit.

8. The modulated impulse generating apparatus according to claim 4, wherein the source signal generator generates a source signal having a stepped waveform by using a dynamic logic circuit that operates by repeatedly charging and discharging a precharge capacitor.

9. A transmission apparatus comprising:
   a baseband processor that generates a baseband signal;
   a modulated impulse generating circuit; and
   an antenna,
   the modulated impulse generating circuit including
   a source signal generator that generates a source signal,
   a first oscillation unit that is an oscillation circuit including one or more amplifiers, and that, when activated, a signal having extracts a desired frequency component from the source signal generated by the source signal generator and causes amplitude of the extracted signal to increase, and
   a second oscillation unit that is arranged at a stage subsequent to the first oscillation unit, is an oscillation circuit including one or more amplifiers, receives input of the signal caused to increase by the first oscillation unit, and that, when activated, causes amplitude of the input signal to increase together with the first oscillation unit and outputs a modulated impulse modulated wave,
   the baseband processor including
   an activation unit that activates the first oscillation unit after the source signal generated by the source signal generator has been input to the first oscillation unit and activates the second oscillation unit after a certain time period has elapsed and oscillation amplitude of the input signal has increased.

* * * * *